United States Patent
Ware et al.

(10) Patent No.: US 9,851,900 B2
(45) Date of Patent: *Dec. 26, 2017

(54) MULTIPLE MEMORY RANK SYSTEM AND SELECTION METHOD THEREOF

(71) Applicant: Rambus Inc., Sunnyvale, CA (US)

(72) Inventors: Frederick A. Ware, Los Altos Hills, CA (US); John Eric Linstadt, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/629,173

(22) Filed: Jun. 21, 2017

(65) Prior Publication Data

US 2017/0285957 A1    Oct. 5, 2017

Related U.S. Application Data

(63) Continuation of application No. 14/441,810, filed as application No. PCT/US2013/072097 on Nov. 26, 2013, now Pat. No. 9,703,483.

(60) Provisional application No. 61/730,436, filed on Nov. 27, 2012.

(51) Int. Cl.
  *G06F 3/06* (2006.01)
  *G11C 8/12* (2006.01)
  *G06F 12/06* (2006.01)

(52) U.S. Cl.
  CPC .......... *G06F 3/0604* (2013.01); *G06F 3/0635* (2013.01); *G06F 3/0673* (2013.01); *G06F 12/06* (2013.01); *G11C 8/12* (2013.01); *G06F 2212/1048* (2013.01); *G11C 2207/107* (2013.01)

(58) Field of Classification Search
  CPC .... G06F 3/0604; G06F 3/0635; G06F 3/0673; G06F 12/06
  See application file for complete search history.

(56) References Cited

U.S. PATENT DOCUMENTS

| 7,043,599 | B1  |   | 5/2006 | Ware et al. |   |
|-----------|-----|---|--------|-------------|---|
| 7,260,691 | B2  | * | 8/2007 | Bains       | G11C 7/1045 711/105 |
| 8,108,643 | B2  | * | 1/2012 | Wallner     | G11C 5/04 711/104 |
| 8,121,237 | B2  |   | 2/2012 | Stott et al. |   |
| 8,130,560 | B1  | * | 3/2012 | Rajan       | G11C 8/00 365/189.03 |
| 8,250,295 | B2  | * | 8/2012 | Amidi       | G11C 5/04 365/230.03 |

(Continued)

*Primary Examiner* — Ryan Bertram
(74) *Attorney, Agent, or Firm* — Lowenstein Sandler LLP (57) ABSTRACT

A multiple memory rank selection method and system assigns, based at least in part on decoding an assignment signal in a second command/address signal, a first terminal of a memory device to receive a first command/address signal and a second terminal of the memory device to receive the second command/address signal or assigns the first terminal of the memory device to receive the second command/address signal and the second terminal of the memory device to receive the first command/address signal. The multiple memory selection method and system decodes a selection signal encoded in the first command/address signal and enables the memory device based at least in part on the assignment signal and the selection signal.

18 Claims, 7 Drawing Sheets

(56) References Cited

U.S. PATENT DOCUMENTS

| | | | |
|---|---|---|---|
| 9,223,718 B2 * | 12/2015 | Vogt | G11C 7/1075 |
| 9,652,170 B2 * | 5/2017 | Vogt | G06F 3/0629 |
| 2008/0082732 A1 | 4/2008 | Karamcheti et al. | |
| 2010/0226185 A1 | 9/2010 | Lee | |
| 2011/0110168 A1 * | 5/2011 | Sung | G11C 5/04 |
| | | | 365/189.09 |
| 2012/0203945 A1 | 8/2012 | Porterfield | |
| 2013/0194854 A1 | 8/2013 | Shaeffer et al. | |
| 2014/0052934 A1 * | 2/2014 | Gopalakrishnan | G11C 7/1075 |
| | | | 711/149 |

* cited by examiner

MULTIPLE MEMORY RANK SYSTEM AND SELECTION METHOD THEREOF

RELATED APPLICATIONS

This application is a continuation application of U.S. patent application Ser. No. 14/441,810 filed on May 8, 2015, which is a national stage application of international application PCT/US2013/072097, filed Nov. 26, 2013, which claims priority to U.S. provisional application 61/730,436, filed Nov. 27, 2012, all of which we incorporate herein by reference in their entirety.

BACKGROUND

Memory systems, such as dual in-line memory modules (DIMMs), may include plural memory ranks. A memory rank may comprise plural memory devices simultaneously available to a controller in any manner, typically by asserting a common chip select (CS) signal. Typically, plural ranks mounted on a DIMM share command/address (CA) signals. Two or more ranks cannot be accessed simultaneously because although the data signals for each memory device on a rank are separate, the data signals are shared between ranks. Plural ranks may coexist on a single DIMM, e.g., one rank, two ranks, four ranks, and so on. Each rank may have any number of individual memory devices of a variety of technologies, e.g., dynamic random access memory (DRAM).

Each rank is typically uniquely associated with a CS signal. A controller may select a particular rank to receive and respond to the CA signals by asserting the CS signal associated with the particular rank. In a memory system in which a DIMM comprises a first rank and a second rank, a first CS signal runs from the controller to the first rank and a second CS signal runs from the controller to the second rank. A controller selects the first rank or the second rank by asserting the first CS signal or the second CS signal, respectively. An additional CS signal will be necessary for each additional rank added to the DIMM, which may be inefficient in some circumstances and may adversely impact DIMM board design, particularly pin out layout and usage at an interface to the controller.

DETAILED DESCRIPTION

Figure 1:
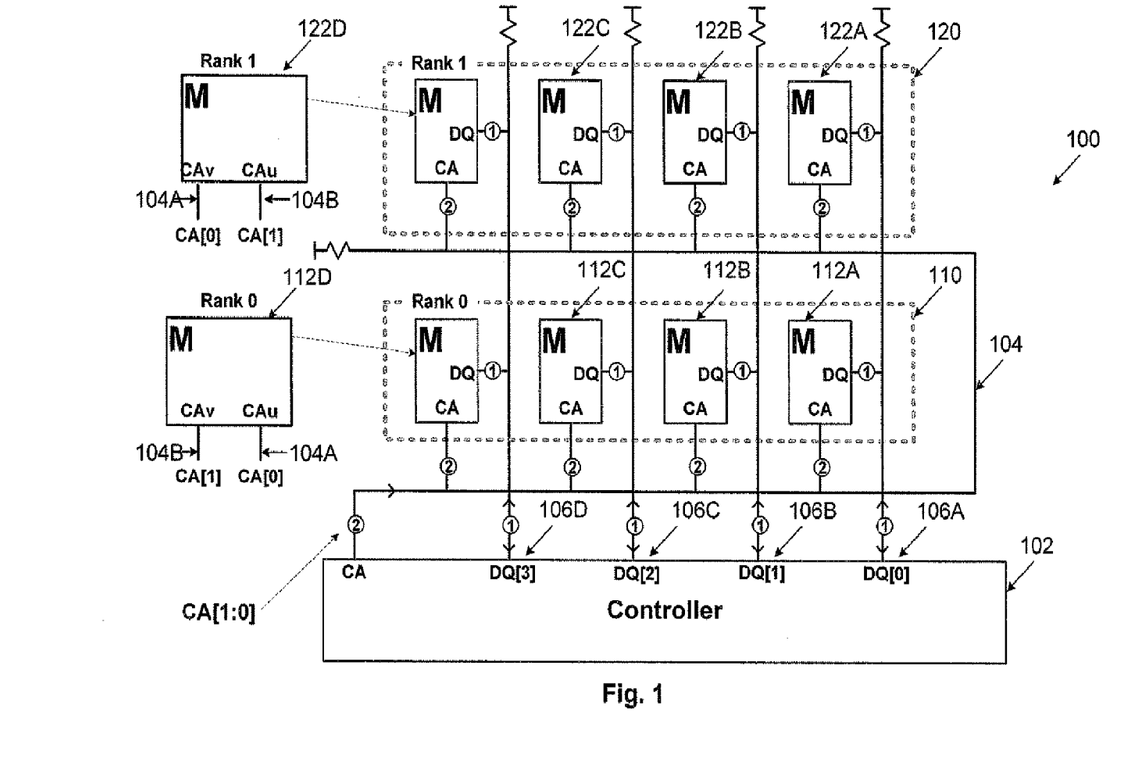
FIG. 1 is a block diagram of a memory system according to an embodiment.

Referring to FIG. 1, a memory system 100 comprises a controller 102 communicatively coupled to a first memory rank 110 and a second memory rank 120 through a command/address bus 104 and a data bus 106A-D. A person of ordinary skill in the art should recognize that memory system 100 may include other bus configurations, e.g., a command bus distinct from an address bus.

Generally, a memory rank such as first memory rank 110 and second memory rank 120 may comprise plural memory devices simultaneously available to a controller. In an embodiment, first memory rank 110 may comprise memory devices 112A, 112B, 112C, and 112D (collectively memory devices 112). Similarly, second memory rank 120 may comprise memory devices 122A, 122B, 122C, and 122D (collectively memory devices 122). A person of ordinary skill in the art should recognize that first memory rank 110 or second memory rank 112 may comprise any number of memory devices, including one, two, four, or eight memory devices or the like. Memory devices 112 or 122 may be dynamic random access memory (DRAM), flash memory, read only memory (ROM), ferroelectric RAM, resistive RAM, or the like.

Controller 102 applies commands and row and column addresses through command/address bus 104 to read data from or write data to first memory rank 110 or second memory rank 120. In a write access, controller 102 provides data to be written to first memory rank 110 or to second memory rank 120 through data bus 106A-D, with individual data bits DQ[0] on line 106A, DQ[1] on line 106B, DQ[2] on line 106C, and DQ[3] on line 106D. In a read access, data read from memory devices 112 on first memory rank 110 or data read from memory devices 122 on second memory rank 120 reaches controller 102 through data bus 106A-D.

Command/address signal CA on command/address bus 104 couples to all memory devices 112 on first memory rank 110 and to all memory devices 122 on second memory rank 120. Controller 102 selects either first memory rank 110 with memory devices 112 or second memory rank 120 with memory devices 122 using command/address signal CA on command/address bus 104 as set forth in more detail below.

Memory system 100 may be configured for a particular data format. In an embodiment, memory system 100 may comprise eight memory devices 112 and 122, each memory device coupled with a single data bit signal. For example, data bit DQ[0] on line 106A couples memory device 112A or memory device 122A to controller 102. Similarly, data bit DQ[1] on line 106B couples memory device 112B or memory device 122B to controller 102, data bit DQ[2] on line 106C couples memory device 112C or memory device 122C to controller 102, and data bit DQ[3] on line 106D couples memory device 112D or memory device 122D to controller 102. In such a case, memory system 100 may input and output data in 4-bit words since the controller selects either first memory rank 110 or second memory rank 120 for memory accesses based at least in part on command/address signal CA. A person of ordinary skill in the art will recognize other possible data formats.

Selection of a data format may control the size of data word but also the effective size of the memory that may be addressed in first memory rank 110 or second memory rank 120. Data bandwidth, i.e., the rate at which data bits are coupled through the data bus, and the depth of the memory system 100, i.e., the number of addressable memory locations in memory system 100, may vary.

Each of memory devices 112 and 122 may comprise first input terminal CAu and second input terminal CAv configured to receive first command/address signal CA[0] or second command/address signal CA[1] from controller 102 on line 104A or line 104B, respectively. In first memory rank 110, first input terminal CAu of memory devices 112 may be coupled to receive first command/address signal CA[0] on line 104A and second input terminal CAv of memory devices 112 may be coupled to receive second command/address signal CA[1] on line 104B.

In second memory rank 120, first input terminal CAu of memory devices 122 may be coupled to receive second command/address signal CA[1] on line 104B and second input terminal CAv of memory devices 122 may be coupled to receive first command/address signal CA[0] on line 104A. By coupling input terminals CAu and CAv of memory devices 112 to receive command/address signals CA[0] and CA[1], respectively, and oppositely or reversely coupling input terminals CAu and CAv of memory devices 122 to receive command/address signals CA[1] and CA[0], respectively, controller 102 may select either first rank 110 or second rank 120. The topology eliminates the need for chip select (CS) to select between memory ranks in system 100. A person of ordinary skill in the art should recognize that system 100 may be expanded to include more than first memory rank 110 and second memory rank 120.

In an embodiment, line 104A may be routed on a first side or a first layer of a printed circuit board housing memory rank 110 from terminal CA[0] of controller 102 to terminal CAu of first memory devices 112 and routed on a second side or a second layer of the printed circuit board housing memory rank 120 from terminal CA[0] of controller 102 to terminal CAv of second memory devices 122. Similarly, a line 104B may be routed on a first side or a first layer of a printed circuit board housing memory rank 110 from terminal CA[1] of controller 102 to terminal CAv of first memory devices 112 and routed on a second side or a second layer of the printed circuit board housing memory rank 120 from terminal CA[1] of controller 102 to terminal CAu of second memory devices 122.

Figure 2A:
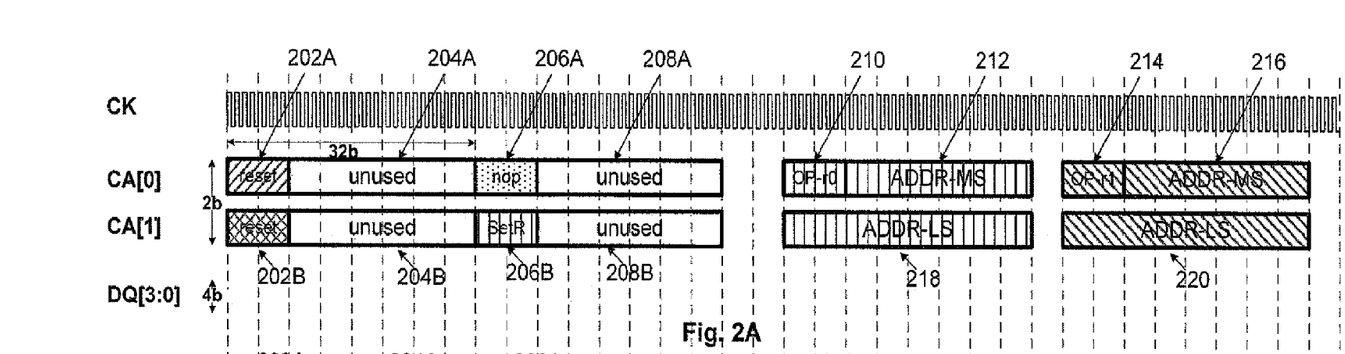
FIGS. 2A and 2B are timing diagrams associated with the memory system shown in FIG. 1.
Figure 2B:
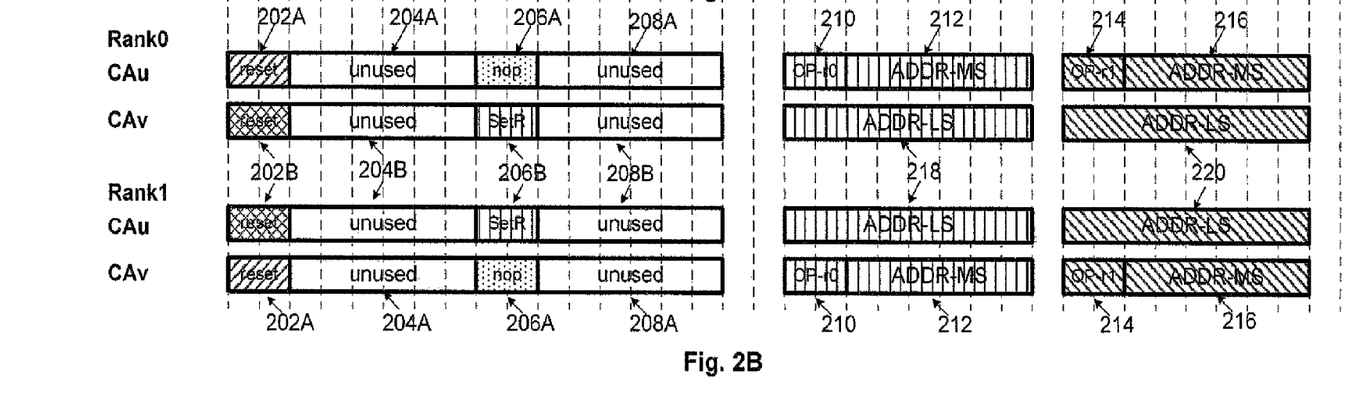

FIGS. 2A and 2B are timing diagrams associated with the memory system 100 shown in FIG. 1. Referring to FIGS. 1, 2A, and 2B, controller 102 provides first command/address signal CA[0] and second command/address signal CA[1] to memory devices 112 on first memory rank 110 and memory devices 122 on second memory rank 120. Controller 102 may configure first command/address signal CA[0] and second command/address signal CA[1] to assign first memory rank 110 and second memory rank 120 during an assignment period that may occur once during initialization or reset. During a first part of the assignment period, controller 102 encodes a reset command in fields 202A and 202B of first command/address signal CA[0] and second command/address signal CA[1], respectively. Controller 102 may encode the reset command in at least a portion of the first command/address signal CA[0], e.g., the first 8 bits of a first 32-bit word in field 202A. Similarly, controller 102 may encode the reset command in at least a portion of the second command/address signal CA[1], e.g., first 8 bits of a first 32-bit word in field 202B. The remaining 24 bits in fields 204A and 204B of the first 32-bit words of first command/address signal CA[0] and second command/address signal CA[1] may remain unused. The reset command may be decoded or parsed by memory devices 112 on first memory rank 110 and memory devices 122 on second memory rank 120. The reset command may reset or initialize the memory devices 112 and memory devices 122 as set forth in more detail with reference to FIGS. 3A and 3B.

During a second part of the assignment period, controller 102 may encode a SetR command in at least a portion of second command/address signal CA[1], e.g., the first 8 bits of a second 32-bit word in field 206B. The remaining 24 bits in field 208B of the second 32-bit word on second command/address signal CA[1] may remain unused. Controller 102 may also encode a NOP (no operation) in at least a portion of first command/address signal CA[0], e.g., the first 8 bits of the second 32-bit word in field 206A. The remaining 24 bits in field 208A of the second 32-bit word on first command/address signal CA[0] may remain unused. Once received, the SetR command is decoded by memory devices 112 on first memory rank 110 and memory devices 122 on second memory rank 120 as set forth in more detail below.

Memory devices 112 on first memory rank 110 receive first command/address signal CA[0] on first input terminal CAu and second command/address signal CA[1] on second input terminal CAv while memory devices 122 on second memory rank 120 receive first command/address signal CA[0] on second input terminal CAv and second command/address signal CA[1] on first input terminal CAu. Thus, the reset command in fields 202A and 202B is received by first input terminals CAu and second input terminals CAv of memory devices 112 on first memory rank 110 and memory devices 122 on second memory rank 120.

The SetR command in field 206B of second command/address signal CA[1] is received on second input terminal CAv of memory devices 112 and on first input terminal CAu of memory devices 122. The SetR command will set an assignment signal R in memory devices 122 on second memory rank 120, while the assignment signal R in memory devices 112 will remain reset (or initialized). In an embodiment, the reset command sets the assignment signal R to a first logic level, e.g., low, on first memory devices 112 and on second memory devices 122. The SetR command sets the assignment signal R to a second logic level, e.g., high, on second memory devices 122. Thus, the reset and SetR command sequence encoded in first and second command/address signals CA[0] and CA[1] results in assignment of memory devices 112 and memory devices 122 that enables controller 102 to select first memory rank 110 or second memory rank 120.

Figure 3A:
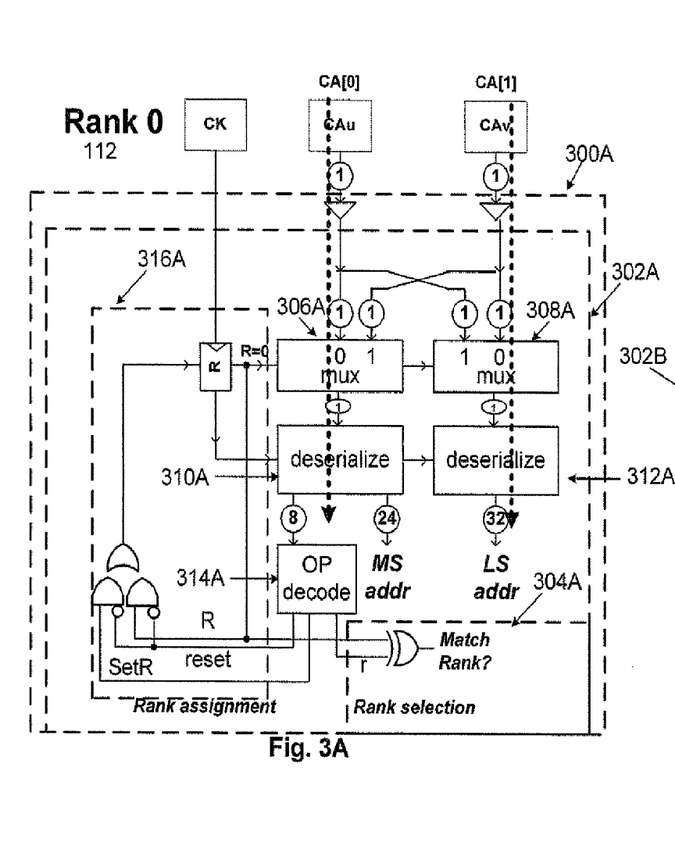
FIGS. 3A and 3B are block diagrams of a logic circuit according to an embodiment of a memory device shown in FIG. 1.
Figure 3B:
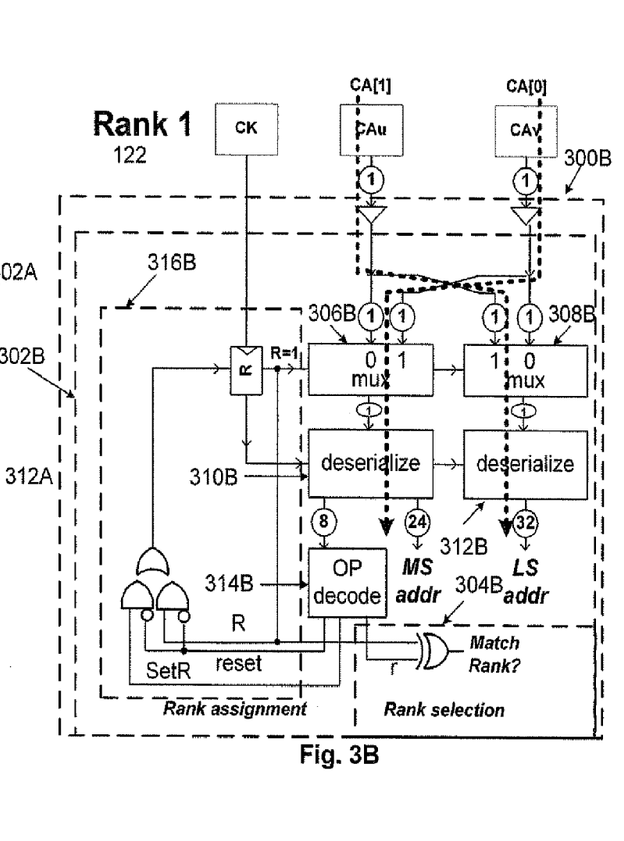

Referring to FIGS. 3A and 3B, memory devices 112 may each include a logic circuit 300A. Logic circuit 300A, in turn, may include assignment circuit 302A and selection circuit 304A. Assignment circuit 302A may decode the reset command, the SetR command, and/or the NOP command encoded in at least a portion of first command/address signal CA[0] or second command/address signal CA[1]. In an embodiment, assignment circuit 302A includes multiplexer circuit 306A, multiplexer circuit 308A, first deserializer circuit 310A, second deserializer circuit 312A, decoder circuit 314A, and assignment logic 316A. Multiplexer 306A may receive first command/address signal CA[0] on a first terminal and second command/address signal CA[1] on a second terminal. Conversely, multiplexer 308A may receive second command/address signal CA[1] on a first terminal and first command/address signal CA[0] on a second terminal. Multiplexer 306A and multiplexer 308A provide first command/address signal CA[0] or second command/address signal CA[1] to first deserializer circuit 310A and second deserializer circuit 312A based at least in part on the assignment signal R output from assignment logic 316A in response to clock signal CK.

The signal selected by multiplexer 306A or multiplexer 308A may be deserialized by circuits 310A and 312A, respectively. In an embodiment, a 32-bit serial word received on first command/address signal CA[0] or second command/address signal CA[1] may be deserialized by circuits 310A and 312A and output as a 32-bit parallel word.

Likewise, memory devices 122 may each include a logic circuit 300B. Logic circuit 300B, in turn, may include assignment circuit 302B and selection circuit 304B. Assignment circuit 302B may decode the reset command, the SetR command, and/or the NOP command encoded in at least a portion of first command/address signal CA[0] or second command/address signal CA[1]. In an embodiment, assignment circuit 302B includes multiplexer circuit 306B, multiplexer circuit 308B, first deserializer circuit 310B, second deserializer circuit 312B, decoder circuit 314B, and assignment logic 316B. Multiplexer 306B may receive first command/address signal CA[0] on a second terminal and second command/address signal CA[1] on a first terminal. Multiplexer 308B may receive second command/address signal CA[1] on a second terminal and first command/address signal CA[0] on a first terminal. Multiplexer 306B and multiplexer 308B provide first command/address signal CA[0] or second command/address signal CA[1] to first deserializer 310B and second deserializer 312B based at least in part on assignment signal R output from assignment logic 316B in response to clock signal CK.

The signal selected by multiplexer 306B or multiplexer 308B may be deserialized by first deserializer 310B and second deserializer 312B, respectively. In an embodiment, a 32-bit serial word received on first command/address signal CA[0] or second command/address signal CA[1] may be deserialized by circuits 310B and 312B and output as a 32-bit parallel word.

During the first part of the assignment period, decoder circuits 314A and 314B may decode at least a portion of first command/address signal CA[0] or second command/address signal CA[1]. In an embodiment, decoder circuit 314A in memory devices 112 on first memory rank 110 decodes the reset command encoded in at least a portion of the first word on first command/address signal CA[0] to reset or initialize assignment signal R to a first logic level, e.g., low. Likewise, decoder circuit 314B in memory devices 122 on second rank 120 decodes the reset command encoded in at least a portion of the first word of first command/address signal CA[0] to reset or initialize assignment signal R to a first logic level, e.g., low.

During the second part of the assignment period, decoder circuit 314B in memory devices 122 decodes the SetR command encoded in at least a portion of a second word on second command/address signal CA[1] while decoder 314A in memory devices 112 decodes the NOP command encoded in at least a portion of the second word on first command/address signal CA[0] based at least in part on assignment signal R. Assignment signal R in memory devices 122 may change from the first logic level, e.g., low, to a second logic level, e.g., high, in response to the decoded SetR command while assignment signal R in memory devices 112 remains at the first logic level, e.g., low, based at least in part on the NOP command Assignment signal R controls the input that multiplexers 306A and 306B and multiplexers 308A and 308B provide to their corresponding output terminals. In an embodiment, assignment signal R is at the first logic level (e.g., low) in memory devices 112 triggering selection of the input at first terminal zero in multiplexers 306A and 308A. Thus, multiplexer 306A provides the first command/address signal CA[0] to its corresponding output terminal while multiplexer 308A provides the second command/address signal CA[1] to its corresponding output terminal. Assignment signal R is at the second logic level (e.g., high) in memory devices 122 triggering selection of the input at second terminal one in multiplexers 306B and 308B. Thus, multiplexer 306B provides the first command/address signal CA[0] to its corresponding output terminal while multiplexer 308B provides the second command/address signal CA[1] to its corresponding output terminal.

During the selection period, selection circuits 304A and 304B enable selection of memory devices 112 on first memory rank 110 or memory devices 122 on second memory rank 120 based at least in part on decoding a selection command received from controller 102, e.g., signal r0 or signal r1, encoded in at least a portion of first command/address signal CA[0].

Referring to FIGS. 2A, 2B, 3A, and 3B, controller 102 may encode the selection command in at least a portion of first command/address signal CA[0] to select first memory rank 110 or second memory rank 120. In an embodiment, controller 102 encodes the selection command, e.g., signal r0 or signal r1, in the first 8 bits of a 32-bit word in field 210 or field 214, respectively, to select first memory rank 110 or second memory rank 120, respectively. Controller 102 may encode most significant address bits in the remaining 24 bits in field 212 and may encode least significant bits in a 32-bit word on second command/address signal CA[1] in field 218. Controller 102 may encode most significant address bits in the remaining 24 bits in field 216 and may encode least significant bits in a 32-bit word on second command/address signal CA[1] in field 220. Selection circuits 304A and 304B compare the decoded selection signal to the assignment signal R using suitable logic to determine selection of first memory rank 110 or second memory rank 120.

Decoder 314A and decoder 314B decode signal r0 encoded in field 210 of first command/address signal CA[0]. Selection circuit 304A positively compares the decoded signal r0 to the assignment signal R, to select first rank 110 and memory devices 112. Note that selection circuit 304B negatively compares the decoded signal r0 to the assignment signal R, since the assignment signal R in selection circuit 304B is at a logic level opposite of the assignment signal R in selection circuit 304A. By doing so, memory devices 122 on second rank 120 ignore subsequent commands on first command/address signal CA[0] or second command/address signal CA[1]. If, on the other hand, controller 102 encodes signal r1 as shown in field 214, selection circuit 304A negatively compares signal r1 to the assignment signal R while selection circuit 304B positively compares signal r1 to the assignment signal R. By doing so, controller 102 selects memory devices 122 on second rank 120, while memory devices 112 on first rank 110 ignore subsequent commands from controller 102.

Figure 4:
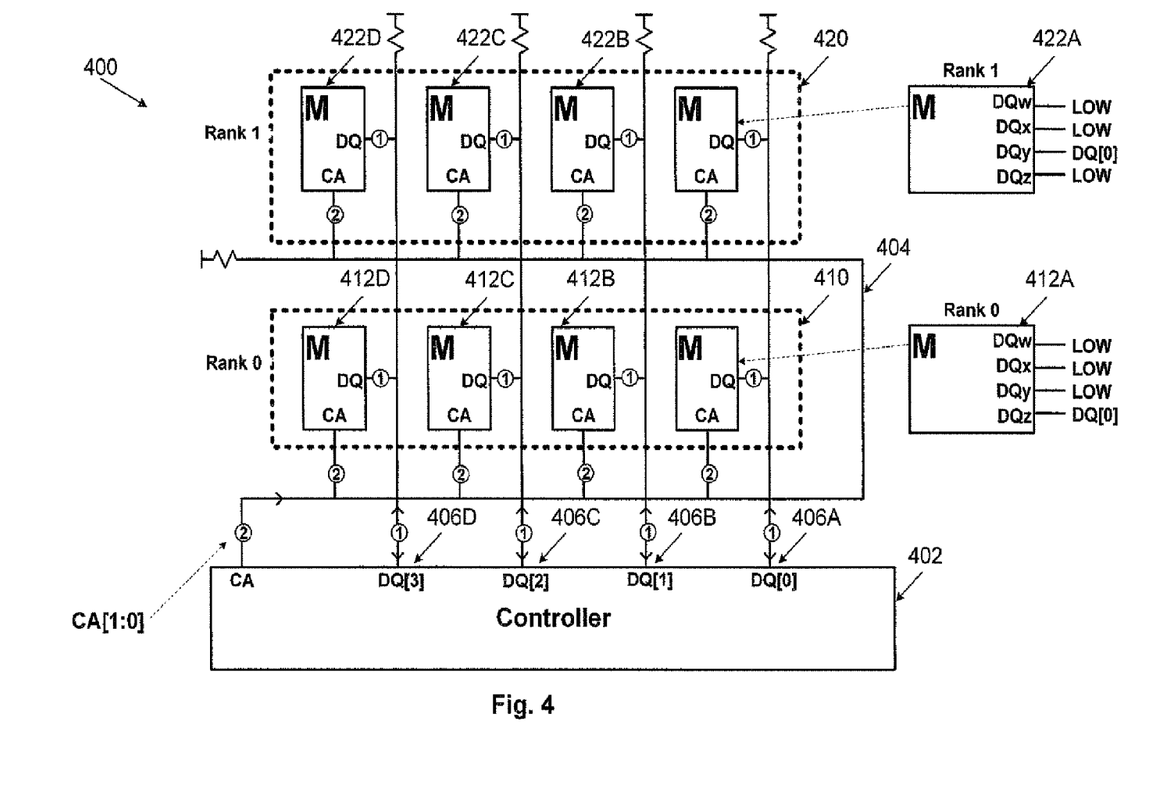
FIG. 4 is a block diagram of a memory system according to an embodiment.

FIG. 4 is a block diagram of a memory system according to another embodiment. Referring to FIGS. 3A, 3B, 4, 5A, 5B, 6A, 6B, or combinations thereof, controller 402 provides first command/address signal CA[0] and second command/address signal CA[1] to memory devices 412A, 412B, 412C, and 412D (collectively memory devices 412) on first memory rank 410 and memory devices 422A, 422B, 422C, and 422D (collectively memory devices 422) on second memory rank 420 through command/address bus 404.

Controller 402 may configure first command/address signal CA[0] and first data signal DQ[0] to assign first memory rank 410 and second memory rank 420 during an assignment period that may occur once during initialization or reset.

Figure 5A:
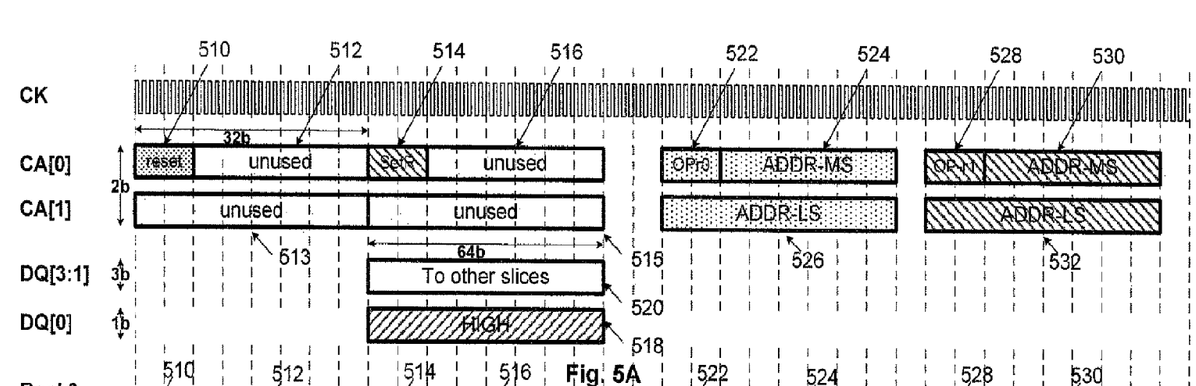
FIGS. 5A and 5B are timing diagrams associated with the memory system shown in FIG. 4.

During a first part of the assignment period, controller 402 encodes a reset command in field 510 of first command/address signal CA[0]. Controller 402 may encode the reset command in at least a portion of the first command/address signal CA[0], e.g., the first 8 bits of a first 32-bit word in field 510. The remaining 24 bits in field 512 of the first 32-bit word of first command/address signal CA[0] and the first 32-bit word of second command/address signal CA[1] in field 513 may remain unused. The reset command may be decoded or parsed by memory devices 412 on first rank 410 and memory devices 422 on second rank 420. The reset command may reset or initialize an assignment signal on the memory devices 412 and memory devices 422. In an embodiment, the reset command will set assignment signal R to a first logic level, e.g., low.

During a second part of the assignment period, controller 402 may encode a SetR command in at least a portion of first command/address signal CA[0], e.g., the first 8 bits of a second 32-bit word in field 514. The remaining 24 bits in field 516 of the second 32-bit word of first command/address signal CA[0] and the second 32-bit word of second command/address signal CA[1] in field 515 may remain unused. Once received, the SetR command is decoded by memory devices 412 on first memory rank 410 and memory devices 422 on second memory rank 420 to set the assignment signal. In an embodiment, the SetR command will set assignment signal R to a second logic level, e.g., high, on memory devices 412 on first memory rank 410.

A person of ordinary skill in the art should recognize that first command/address signal CA[0] and second command/address signal CA[1] may be 32-bit single data rate (SDR) signals while data signals DQ[0]-[3] may be 64-bit double rate data (DDR) signals.

Figure 5B:
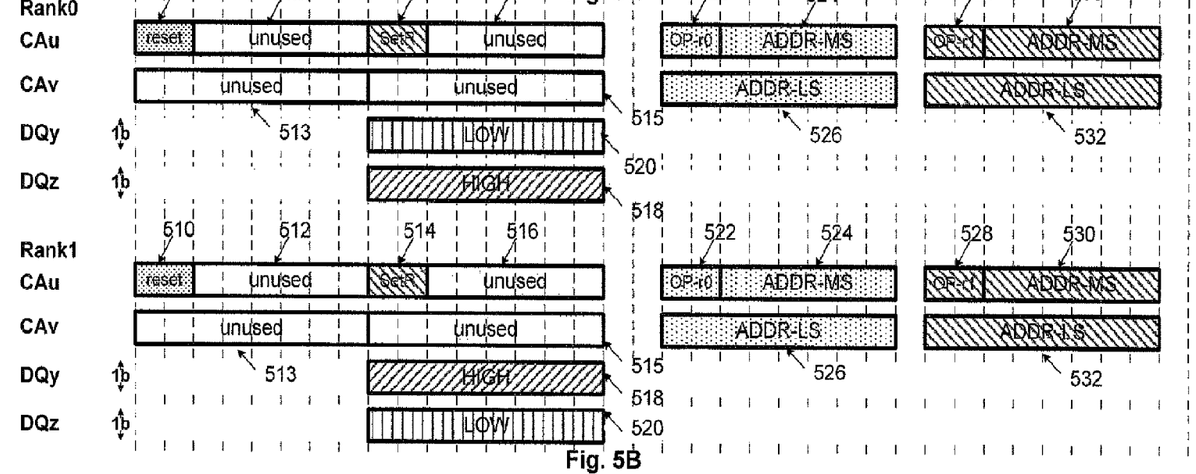

Memory devices 412 on first memory rank 410 receive first data signal DQ[0] on first input terminal DQz while memory devices 422 on second rank 420 receive first data signal DQ[0] on second input terminal DQy. Controller 402 may set first data signal DQ[0] to the second logic level, e.g., high, in field 518 while setting other data signals DQ[1], DQ[2], and DQ[3] to the first logic level, e.g., low, in field 520 during the assignment period.

Figure 6A:
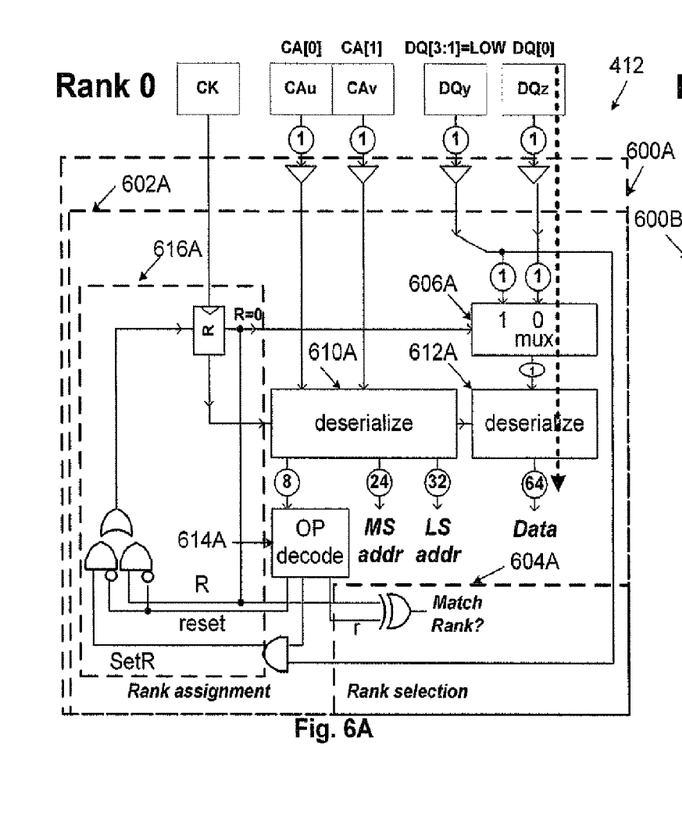
FIGS. 6A and 6B are block diagrams of a logic circuit according to an embodiment of a memory device shown in FIG. 4.
Figure 6B:
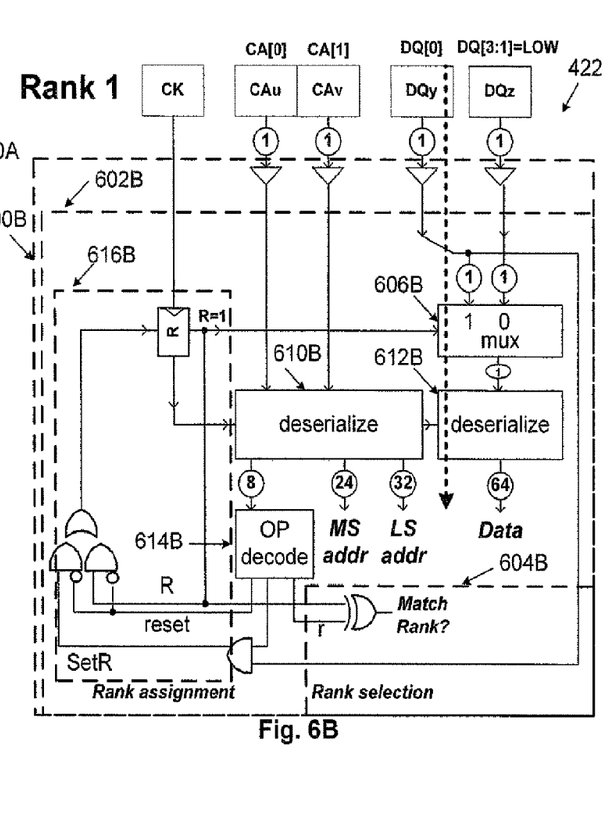

Referring to FIGS. 6A and 6B, memory devices 412 may each include a logic circuit 600A. Logic circuit 600A, in turn, may include assignment circuit 602A and selection circuit 604A. Assignment circuit 602A may decode the reset command and the SetR command encoded in at least a portion of first command/address signal CA[0]. In an embodiment, assignment circuit 602A includes multiplexer circuit 606A, first deserializer circuit 610A, second deserializer circuit 612A, decoder circuit 614A, and assignment logic 616A. Multiplexer 606A may select a data signal received at input terminal DQy or input terminal DQz and provide the selected data signal to second deserializer 612A, based at least in part on assignment signal R output from assignment logic 616A in response to clock signal CK. Second deserializer 612A may convert the selected data signal from a serial data signal to a parallel data signal at its output. In an embodiment, second deserializer 612A converts data signals DQ from 64-bit serial words to 64-bit parallel words.

First deserializer 610A may convert first command/address signal CA[0] received on first input terminal CAu and second command/address signal CA[1] received on second input terminal CAv from serial signals to parallel signals. In an embodiment, first deserializer 610A converts first command/address signal CA[0] and second command/address signal CA[1] from 32-bit serial words to 32-bit parallel words.

Likewise, memory devices 422 may each include a logic circuit 600B. Logic circuit 600B, in turn, may include assignment circuit 602B and select circuit 604B. Assignment circuit 602B may decode the reset command and the SetR command encoded in at least a portion of first command/address signal CA[0]. In an embodiment, assignment circuit 602B includes multiplexer circuit 606B, first deserializer circuit 610B, second deserializer circuit 612B, decoder circuit 614B, and assignment logic 616B. Multiplexer 606B may select a data signal received at input terminal DQy or input terminal DQz and provide the selected data signal to second deserializer 612B, based at least in part on assignment signal R output from assignment logic 616B in response to clock signal CK. Second deserializer 612B may convert the selected data signal from a serial data signal to a parallel data signal at its output. In an embodiment, second deserializer 612B converts data signals DQ from 64-bit serial words to 64-bit parallel words.

First deserializer 610B may convert first command/address signal CA[0] received on first input terminal CAu and second command/address signal CA[1] received on second input terminal CAv from serial signals to parallel signals. In an embodiment, first deserializer 610B converts first command/address signal CA[0] and second command/address signal CA[1] from 32-bit serial words to 32-bit parallel words.

During the first part of the assignment period, decoder circuit 614A and decoder circuit 614B may decode at least a portion of first command/address signal CA[0]. In an embodiment, decoder circuit 614A in memory devices 412 and decoder circuit 614B in memory devices 422 decode the reset command encoded in at least a portion of the first word on first command/address signal CA[0] to reset or initialize assignment signal R to a first logic level, e.g., low.

During the second part of the assignment period, multiplexer 606A selects first data signal DQ[0] at input terminal DQz while multiplexer 606B selects any of data signals DQ[1], DQ[2], or DQ[3] at input terminal DQz based at least in part on assignment signal R having been reset to a first logic level during the first part of the assignment period. Logic circuit 616A generates assignment signal R for memory devices 412 on first memory rank 410 while logic circuit 616B generates assignment signal R for memory devices 422 on second memory rank 420 based at least in part on a data signal received at input terminal DQy. Both logic circuit 616A and logic circuit 616B generate assignment signal R based at least in part on the reset command and the SetR command encoded in at least a portion of the first command/address signal CA[0]. Logic circuit 616A generates assignment signal R also based at least in part on any of data signals DQ[1], DQ[2], or DQ[3] received at input terminal DQy. Logic circuit 616B, in contrast, generates the assignment signal R based at least in part on first data signal DQ[0]. During the second part of the assignment period, the first data signal DQ[0] is set to second logic level, e.g., high. Since the first data signal DQ[0] is provided on input DQz on memory devices 412 and is provided on input DQy to memory devices 422, the assignment signal R changes in memory devices 422 in second rank 420 from a first logic level, e.g., low, to a second logic level, e.g., high, in response to logic circuit 616B. Assignment signal R remains unchanged in memory devices 412 in first rank 410. By doing so, controller 402 may select memory devices 412 in first rank 410 or select memory devices 422 in second rank 420 as set forth below.

During a selection period, selection circuit 604A enables selection of memory devices 412 on first rank 410 or memory devices 422 on second rank 420 based at least in part on decoding a selection command received from controller 102, e.g., selection signal r, encoded in at least a portion of first command/address signal CA[0].

Referring to FIGS. 3A, 3B, 4, 5A, 5B, 6A, and 6B, controller 402 may encode the selection command in at least a portion of first command/address signal CA[0] to select memory devices 412 in first memory rank 410 or memory devices 422 in second memory rank 420. In an embodiment, controller 402 encodes the selection command, e.g., selection signal r, in the first 8 bits of a 32-bit word in field 522 to select first rank 410 or second rank 420, respectively. Controller 402 encodes most significant address bits in the remaining 24 bits in field 524 and encodes least significant bits in a 32-bit word on second command/address signal CA[1] in field 526. Controller 402 may encode most significant address bits in the remaining 24 bits in field 530 and may encode least significant bits in a 32-bit word on second command/address signal CA[1] in field 532. Selection circuit 604A and selection circuit 604B compare the decoded selection signal r to the assignment signal R using suitable logic to determine selection of first rank 410 or second rank 420.

Decoder 614A and decoder 614B decode selection signal r encoded in field 522 of first command/address signal CA[0]. Selection circuit 604A may positively compare the decoded signal r to assignment signal R, which was set low during the assignment period, to select first rank 410 and memory devices 412. Note that, in this case, selection circuit 604B may negatively compare the decoded signal r to assignment signal R, since assignment signal R was set high during the assignment period. By doing so, memory devices 422 on second rank 420 ignore subsequent commands from controller 402 on first command/address signal CA[0] or second command/address signal CA[1]. On the other hand, selection circuit 604A may negatively compare selection signal r to assignment signal R while selection circuit 604B positively compares selection signal r to assignment signal R. By doing so, controller 402 selects memory devices 422 on second memory rank 420, while memory devices 412 on first memory rank 410 ignore subsequent commands from controller 402 on first command/address signal CA[0] or second command/address signal CA[1].

Figure 7:
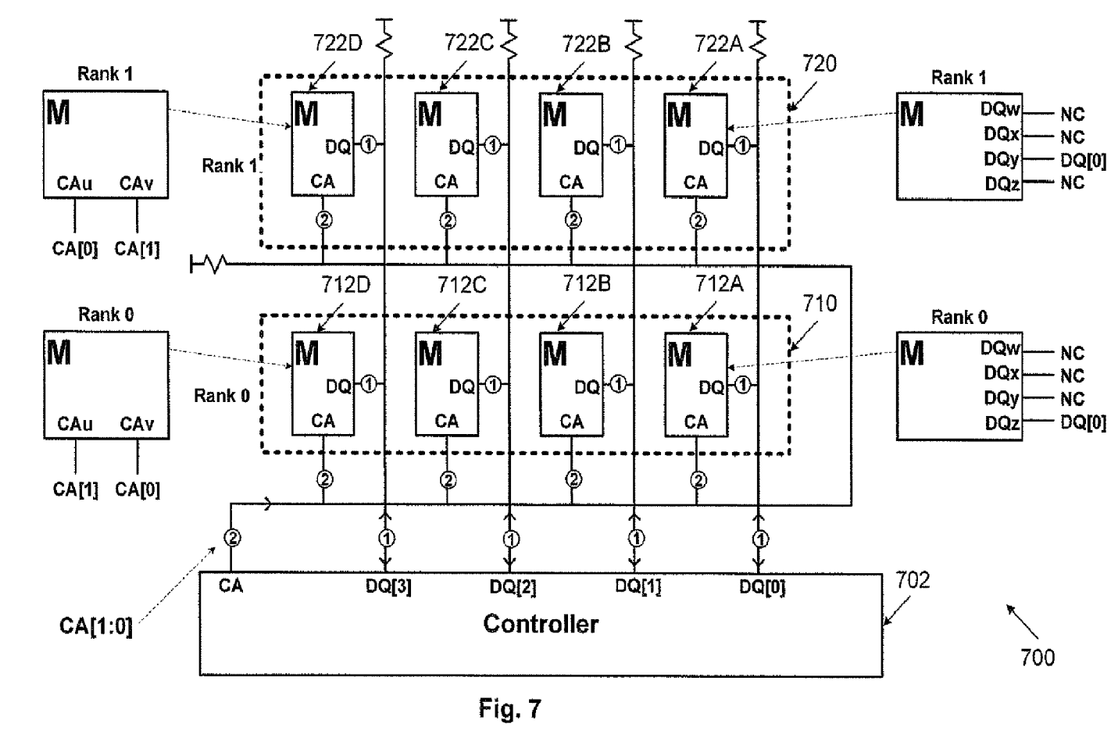
FIG. 7 is a block diagram of a memory system according to an embodiment.

FIG. 7 is a block diagram of a memory system according to yet another embodiment in which the memory devices 712A-D on first memory rank 710 and memory devices 722A-D on second memory rank 720 have both two input terminals CAu and CAv as in the embodiments shown in FIG. 2 and multiple data inputs including DQy and DQz as in the embodiments shown in FIG. 6.

A person of ordinary skill in the art will recognize that they may make many changes to the details of the above-described embodiments without departing from the underlying principles. Only the following claims, however, define the scope of the embodiments.

What is claimed is:

1. A controller comprising:
   a storage device to store instructions; and
   a processing device to execute the instructions stored in the storage device to:
      reset at least one first memory device on a first rank and at least one second memory device on a second rank based at least in part on a reset signal encoded in a first command/address signal and in a second command/address signal and transmitted to the at least one first memory device and to the at least one second memory device;
      assign a first terminal of the at least one first memory device or of the at least one second memory device to receive the first command/address signal or the second command/address signal and assign a second terminal of the at least one first memory device or of the at least one second memory device to receive the first command/address signal or the second command/address signal based at least in part on an assignment signal encoded in the second command/address signal and transmitted to the at least one first memory device and to the at least one second memory device; and
      select the first rank or the second rank based at least in part on a selection signal encoded in the first command/address signal and transmitted to the at least one first memory device and to the at least one second memory device.

2. The controller of claim 1, wherein the processing device executes the instructions stored in the storage device further to:
   transmit the reset signal to the first terminal and to the second terminal of the at least one first memory device; and
   transmit the reset signal to the first terminal and to the second terminal of the at least one second memory device.

3. The controller of claim 2, wherein the processing device executes the instructions stored in the storage device further to:
   transmit the assignment signal to the second terminal of the at least one first memory device; and
   transmit the assignment signal to the first terminal of the at least one second memory device.

4. The controller of claim 3, wherein the processing device executes the instructions stored in the storage device further to:
   transmit the selection signal to the first terminal of the at least one first memory device; and
   transmit the selection signal to the second terminal of the at least one second memory device.

5. A computer-readable storage medium having instructions stored thereon that, in response to execution by a processing device, causes the processing device to perform operations comprising:
   resetting at least one first memory device on a first rank and at least one second memory device on a second rank by encoding a reset signal in a first command/address signal and in a second command/address signal and transmitting the reset signal to the at least one first memory device and to the at least one second memory device;
   assigning a first terminal of the at least one first memory device or of the at least one second memory device to receive the first command/address signal or the second command/address signal and assigning a second terminal of the at least one first memory device or of the at least one second memory device to receive the first command/address signal or the second command/address signal by encoding an assignment signal in the second command/address signal and transmitting the assignment signal to the at least one first memory device and to the at least one second memory device; and
   selecting the first rank or the second rank by encoding a selection signal in the first command/address signal and transmitting the selection signal to the at least one first memory device and to the at least one second memory device.

6. The computer-readable storage medium of claim 5, wherein execution of the instructions causes the processing device to perform operations further comprising:

transmitting the reset signal to the first terminal and to the second terminal of the at least one first memory device; and transmitting the reset signal to the first terminal and to the second terminal of the at least one second memory device.

7. The computer-readable storage medium of claim 6, wherein execution of the instructions causes the processing device to perform operations further comprising:
transmitting the assignment signal to the second terminal of the at least one first memory device; and
transmitting the assignment signal to the first terminal of the at least one second memory device.

8. The computer-readable storage medium of claim 7, wherein execution of the instructions causes the processing device to perform operations further comprising:
transmitting the selection signal to the first terminal of the at least one first memory device; and
transmitting the selection signal to the second terminal of the at least one second memory device.

9. A method comprising:
resetting at least one first memory device on a first rank and at least one second memory device on a second rank by encoding a reset signal in a first command/address signal and in a second command/address signal and transmitting the reset signal to the at least one first memory device and to the at least one second memory device;
assigning a first terminal of the at least one first memory device or of the at least one second memory device to receive the first command/address signal or the second command/address signal and assigning a second terminal of the at least one first memory device or of the at least one second memory device to receive the first command/address signal or the second command/address signal by encoding an assignment signal in the second command/address signal and transmitting the assignment signal to the at least one first memory device and to the at least one second memory device; and
selecting the first rank or the second rank by encoding a selection signal in the first command/address signal and transmitting the selection signal to the at least one first memory device and to the at least one second memory device.

10. The method of claim 9, further comprising:
transmitting the reset signal to the first terminal and to the second terminal of the at least one first memory device; and
transmitting the reset signal to the first terminal and to the second terminal of the at least one second memory device.

11. The method of claim 10, further comprising:
transmitting the assignment signal to the second terminal of the at least one first memory device; and
transmitting the assignment signal to the first terminal of the at least one second memory device.

12. The method of claim 1, further comprising:
transmitting the selection signal to the first terminal of the at least one first memory device; and
transmitting the selection signal to the second terminal of the at least one second memory device.

13. A system comprising:
a first rank comprising at least one first memory device including a first input terminal and a second input terminal;

a second rank comprising at least one second memory device including a first input terminal and a second input terminal; and a controller configured to:
reset that at least one first memory device of the first rank and that at least one second memory device of the second rank based at least in part on a reset signal encoded in a first command/address signal and in a second command/address signal and transmitted to the at least one first memory device and to the at least one second memory device;
assign the first terminal of the at least one first memory device or of the at least one second memory device to receive the first command/address signal or the second command/address signal and assign the second terminal of the at least one first memory device or of the at least one second memory device to receive the first command/address signal or the second command/address signal based at least in part on an assignment signal encoded in the second command/address signal and transmitted to the at least one first memory device and to the at least one second memory device; and
select the first rank or the second rank based at least in part on a selection signal encoded in the first command/address signal and transmitted to the at least one first memory device and to the at least one second memory device.

14. The system of claim 13, the controller further configured to:
transmit the reset signal to the first terminal and to the second terminal of the at least one first memory device; and
transmit the reset signal to the first terminal and to the second terminal of the at least one second memory device.

15. The system of claim 14, the controller further configured to:
transmit the assignment signal to the second terminal of the at least one first memory device; and
transmit the assignment signal to the first terminal of the at least one second memory device.

16. The system of claim 15, the controller further configured to:
transmit the selection signal to the first terminal of the at least one first memory device; and
transmit the selection signal to the second terminal of the at least one second memory device.

17. The system of claim 13, the controller further comprises a data terminal configured to transmit a data signal to the at least one of the first memory device or the at least one second memory device.

18. The system of claim 13, further comprising:
a printed circuit board housing the first rank, the second rank, and the controller, the printed circuit board having:
a first command/address signal trace routed on a first side or a first layer of the printed circuit board from a first controller terminal of the controller to the first input terminal of the at least one first memory device and routed on a second side or a second layer of the printed circuit board from the first controller terminal to the second input terminal of the at least one second memory device; and
a second command/address signal trace routed on the first side or the first layer of the printed circuit board from a second controller terminal of the controller to the second input terminal of the at least one first memory device and routed on the second side or the second layer of the printed circuit board from the second controller terminal to the first input terminal of the at least one second memory device.

* * * * *